US009229038B2

(12) United States Patent
Botten

(10) Patent No.: US 9,229,038 B2
(45) Date of Patent: Jan. 5, 2016

(54) CABINET TOUCH CONTROL

(71) Applicant: Peter Botten, Lakewood, OH (US)

(72) Inventor: Peter Botten, Lakewood, OH (US)

( * ) Notice: Subject to any disclaimer, the term of this patent is extended or adjusted under 35 U.S.C. 154(b) by 0 days.

(21) Appl. No.: 13/900,639

(22) Filed: May 23, 2013

(65) Prior Publication Data

US 2013/0249568 A1 Sep. 26, 2013

(51) Int. Cl.

| | |
|---|---|
| ***G01R 27/04*** | (2006.01) |
| ***G01R 27/26*** | (2006.01) |
| ***H03K 17/945*** | (2006.01) |
| ***H03K 17/96*** | (2006.01) |

(52) U.S. Cl.

CPC .......... *G01R 27/2605* (2013.01); *H03K 17/945* (2013.01); *H03K 17/962* (2013.01); *H03K 2217/96066* (2013.01); *H03K 2217/960755* (2013.01); *H03K 2217/960785* (2013.01)

(58) Field of Classification Search

USPC .............. 324/658, 661, 686, 629; 108/20, 21, 108/147, 147.19

See application file for complete search history.

(56) References Cited

U.S. PATENT DOCUMENTS

| | | | | |
|---|---|---|---|---|
| 5,323,695 | A * | 6/1994 | Borgman et al. | 108/147 |
| 6,595,144 | B1 * | 7/2003 | Doyle | 108/147 |
| 7,652,230 | B2 * | 1/2010 | Baier | 219/483 |
| 2007/0170826 | A1 * | 7/2007 | Tsao | 312/223.3 |
| 2008/0073949 | A1 * | 3/2008 | Rozman | 297/188.14 |
| 2008/0245279 | A1 * | 10/2008 | Pan | 108/144.11 |
| 2009/0078167 | A1 * | 3/2009 | Ellegaard | 108/21 |
| 2012/0248992 | A1 * | 10/2012 | Jeon et al. | 315/155 |
| 2012/0280544 | A1 * | 11/2012 | Wiley | 297/188.14 |
| 2013/0100033 | A1 * | 4/2013 | Yuan et al. | 345/172 |
| 2013/0106774 | A1 * | 5/2013 | Radivojevic et al. | 345/174 |

* cited by examiner

*Primary Examiner* — Huy Q Phan
*Assistant Examiner* — Thang Le
(74) *Attorney, Agent, or Firm* — Pearne & Gordan LLP

(57) ABSTRACT

Provided is a method and an apparatus for controlling an electric device. The apparatus includes a cabinet defining a recess, and a sensor disposed within said recess for sensing the presence of a foreign object in close proximity to the sensor. A veneer at least partially conceals the sensor disposed within said recess from view when observed from an ambient environment of the cabinet. A controller is responsive to a signal transmitted by the sensor indicative of the presence of the foreign object adjacent to the sensor to transmit a control signal for controlling operation of the electric device operatively connected to communicate with the controller.

6 Claims, 4 Drawing Sheets

CABINET TOUCH CONTROL

BACKGROUND OF THE INVENTION

1. Field of the Invention

This application relates generally to capacitive sensors and, in particular, to a cabinet, piece of furniture or other object including an integrated capacitive sensor for controlling operation of an electric device.

2. Description of Related Art

Capacitive sensors are found in many devices and applications. Light switches, elevator buttons, computer touch-screens and controls on electronic equipment are examples of a few common applications. Typically, the capacitive sensors are in plain view, clearly delineated on the applicable device. For example, a wall switch with a touch pad, the appearance of buttons in an elevator, a touch-sensitive screen itself, and various indicia and/or discrete touch surfaces in other equipment are exposed and readily viewed by individuals, even when such sensors are not actively being used.

An exposed sensor can give objects an unsightly appearance for users to view.

BRIEF SUMMARY OF THE INVENTION

Capacitive sensors are found in many devices and applications. Light switches, elevator buttons, computer touch-screens and controls on electronic equipment are examples of a few common applications. Typically, the capacitive sensors are in plain view, clearly delineated on the applicable device. For example, a wall switch with a touch pad, the appearance of buttons in an elevator, a touch-sensitive screen itself, and various indicia and/or discrete touch surfaces in other equipment are exposed and readily viewed by individuals, even when such sensors are not actively being used.

According to one aspect, the subject application involves a method for mounting a capacitive sensor in a cabinet or piece of furniture, and a cabinet or piece of furniture with such a capacitive sensor, and the capacitive sensor itself. According to one aspect, the subject application involves providing a capacitive sensor configured on a sensor side of a printed circuit board; and fabricating a cavity in a wall of said cabinet or piece of furniture, the cavity being configured to receive the printed circuit board so that the capacitive sensor is contained within the wall and is within 0.125 inches of a touchable surface of the wall.

According to another aspect, the subject application involves an apparatus for controlling an electric device. The apparatus includes a cabinet defining a recess, and a sensor disposed within said recess for sensing the presence of a foreign object in close proximity to the sensor. A veneer at least partially conceals the sensor disposed within said recess from view when observed from an ambient environment of the cabinet. A controller is responsive to a signal transmitted by the sensor indicative of the presence of the foreign object adjacent to the sensor to transmit a control signal for controlling operation of the electric device operatively connected to communicate with the controller.

According to another aspect, the sensor is a capacitive sensor that senses a capacitance change resulting from placement of the foreign object in close proximity to the sensor.

According to another aspect, the cabinet is a portion of a piece of furniture, and the recess is formed in an arm rest portion of the piece of furniture on which a user is to sit.

According to another aspect, the cabinet is a portion of a lamp, and the recess is formed in a base portion of the lamp.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF SEVERAL VIEWS OF THE DRAWING

The invention may take physical form in certain parts and arrangement of parts, embodiments of which will be described in detail in this specification and illustrated in the accompanying drawings which form a part hereof and wherein.

DETAILED DESCRIPTION OF THE INVENTION

Figure 1:
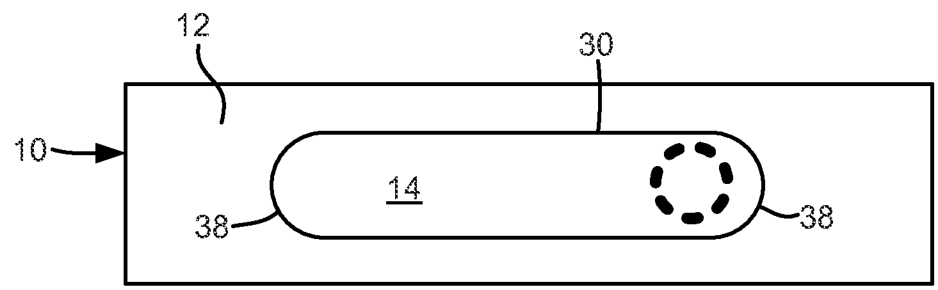
FIG. 1 is a schematic top view of a capacitive sensor embedded in a wall before application of a wall veneer according to an aspect of the invention.

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

It is also to be noted that the phrase "at least one of", if used herein, followed by a plurality of members herein means one of the members, or a combination of more than one of the members. For example, the phrase "at least one of a first widget and a second widget" means in the present application: the first widget, the second widget, or the first widget and the second widget. Likewise, "at least one of a first widget, a second widget and a third widget" means in the present application: the first widget, the second widget, the third widget, the first widget and the second widget, the first widget and the third widget, the second widget and the third widget, or the first widget and the second widget and the third widget.

Referring to FIG. 1, a portion of a wall 10 of a cabinet or a piece of furniture has an upper surface 12 that includes a capacitive sensor 14 countersunk into the surface 12 of the wall 10. The sensor 14 is flush with the surface 12 and a veneer 16 (see FIG. 4) is then bonded to the surface 12 as well as to the sensor 14. Bonding to the sensor 14 helps prevent wrinkling or blistering of the veneer 16.

The wall 10 may be, for example, solid wood, wood fiber products or other non-metallic material suitable for construction of cabinets or furniture. Similarly, the veneer 16 may be, for example, wood veneer, laminate or other non-metal material suitable for construction of cabinets or furniture. The veneer 16 may be bonded to the wall 10 and the sensor 14, for example, with adhesive, thermally, or ultrasonically as appropriate for the materials.

For satisfactory performance of the sensor 14, the thickness of the veneer 16 (e.g., the dimension normal to a major surface of the veneer 16) can be limited to less than a threshold maximum for the sensitivity of the particular sensor. Thicknesses greater than the threshold maximum can begin to interfere with the ability of the sensor 14 to detect the presence of a user's hand, for example. For example, the thickness of the veneer 16 can be approximately 0.125 inches or less. Other embodiments include a veneer that is approximately 0.010 inches or less. Typically, the thinner the veneer, the better is the performance of the sensor 14. A thickness of 0.025 inches can be suitable for certain applications, and can optionally be any commercially available veneer 16 thickness.

The veneer 16 can optionally have an externally-exposed surface 37 (FIG. 3) with an appearance resembling wood or other material from which the cabinet 10 or furniture is made. Such embodiments of the veneer 16 can optionally conceal the sensor 14 embedded in the cabinet 10 or furniture beneath the veneer 16. Alternate embodiments of the veneer 16 can include an appearance with a visible indicator that is viewable when observing the externally-exposed surface 37, indicating a location where the cabinet 10 or furniture can be touched to control operation of an electric device 39, described in detail below.

Figure 2:
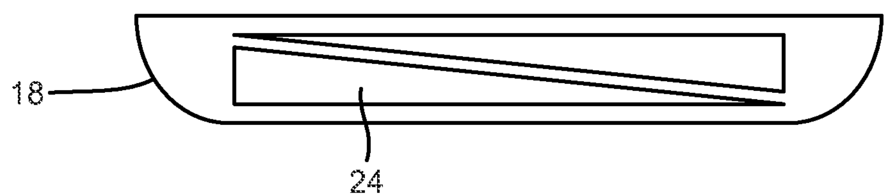
FIG. 2 is a schematic top view of illustrative examples of capacitive sensor configurations.
Figure 2:
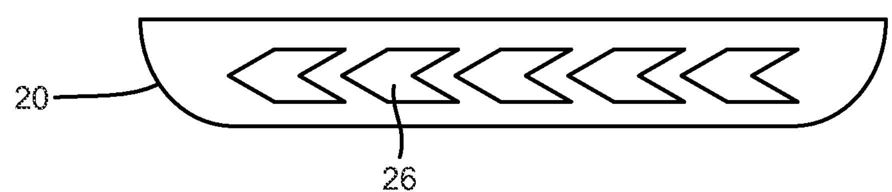
Figure 2:
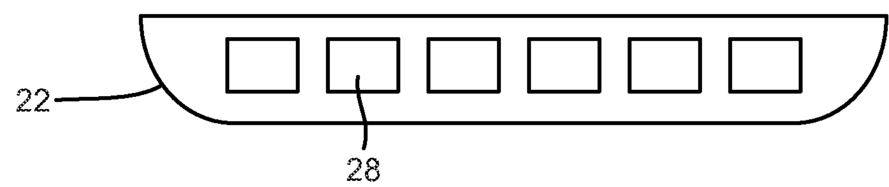

Referring to FIG. 2, examples 18, 20, 22 of the operable surface of the sensor 14 are shown (these examples are most suitable for the embodiment of FIG. 4 described below). In each of the examples 18, 20, 22, a capacitively coupleable pattern 24, 26, 28, respectively, is provided. The patterns 24, 26, 28 are formed on the top of a printed circuit board 30, typically by etching. The printed circuit boards can advantageously be the same thickness as standard router bits (e.g., 1/16" and 3/32"). The sensors are used, for example, to provide off/on, selection, and variable "slider" functions for the operation of electrical equipment such as lighting, stereos, computers and audio-visual equipment.

Figure 3:
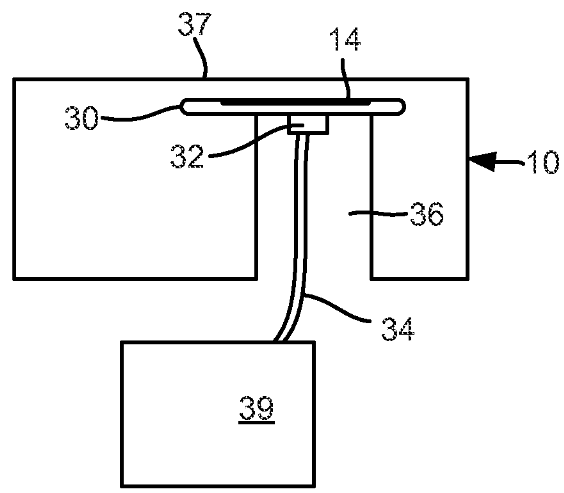
FIG. 3 is a schematic side view of a capacitive sensor according to still another aspect of the invention.

Referring to FIG. 3, the bottom of the printed circuit board 30 includes circuitry 32 for the operation of the capacitive sensor 14 including wiring 34 for connection to an electric device 39, such as a television, video receiver, lamp or other light fixture, an electrical device provided to the cabinet 10 or furniture itself, etc. . . . , controlled by touching the externally-exposed surface 37 of the veneer 16 above the sensor 14. The surface of the printed circuit board may be surface treated to resist the chemicals present in wood and adhesives.

A cavity for the sensor 14 in the wall 10 may be advantageously fabricated by routing out the shape and thickness of the printed circuit board 30. The printed circuit board 30 may have rounded ends 38 that match the smallest radius turns made by a router bit when routing out the cavity. For example, the printed circuit board end radiuses, either half-round or quarter-round may match standard router bit and biscuit cutter diameters (e.g., ½" and ¾" diameter). By matching the router bit profile, a snug fit can be obtained. A space 36 for the circuitry 32 and the wires 34 can be bored in the wall 10. The circuitry 32 may be designed to specifically fit in the space 36.

An alternative method for fabricating a cavity for the sensor 14 is to route the cavity in the wall 10 from the back of the wall 10. In this case, it is possible to eliminate the use of a separate veneer 16, leaving a monolithically formed wall and externally-exposed surface 37 concealing the sensor 14 from view when observed from the ambient environment of the cabinet or furniture. Instead, the routing process simply leaves the existing outwardly-exposed surface 37 of the wall 10 in place above the sensor 14. For satisfactory performance of the sensor 14, this remaining upper surface of the wall 10 should be 0.124 inches in thickness or less. As before, the sensor 14 can be bonded to the surface above it, particularly as the thickness may be as little as 0.010 inches, or at least placed against the surface. The veneer 16, the remaining upper surface of the wall 10, or other wood overlay can optionally be finished with an optional clear coat finish that is at least partially adsorbed into the wood. Examples of such finishes include, but are not limited to a shellac, polyurethane, oil based finishes, etc. . . . that can aid in the efficiency of light transmission and/or touchpad sensitivity.

Figure 4:
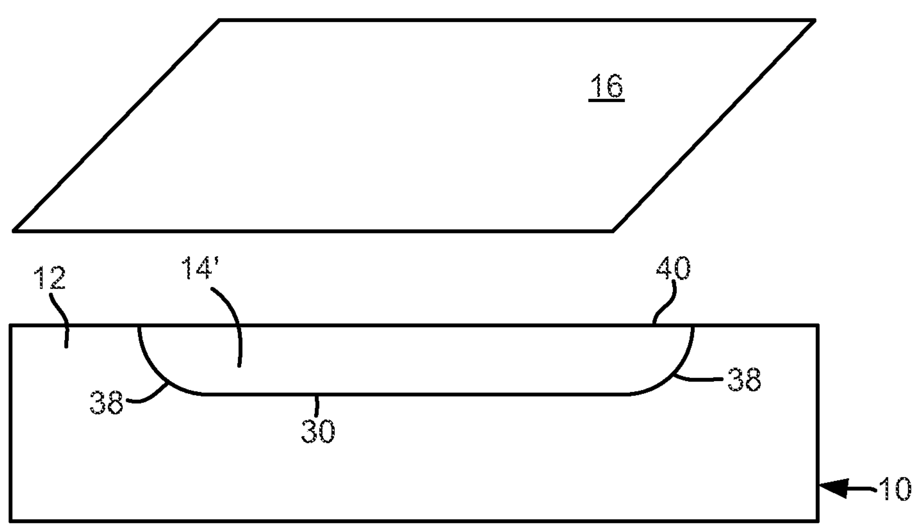
FIG. 4 is a schematic top view of an edge mounted capacitive sensor and a portion of unbonded wall veneer according to an additional aspect of the invention.

Referring to FIG. 4, an edge mount sensor 14' is shown mounted at the edge of a wall 10. In this case, the sensor 14' is provided with a straight side 40 that corresponds to the edge of the wall 10. Typically, this edge will be covered either with another veneer or the like, or by a joint with another wall of the cabinet or piece of furniture.

The printed circuit board 30 may be of flexible construction to allow use where the surface above the sensor 14 is curved, such as in cylindrical floor lamp posts.

The circuitry 32 (or controllers in an attached device) may perform a variety of functions, such as lamp intensity control. For example, on/off with a double tap, or change in intensity (0, 20, 40, 60, 80, 100%) with single taps, or continuously variable (e.g., as a dimmer switch) when a slider control is used. Special tap sequences can enable special modes, such as color change when driving a RGB LED lamp.

Alternate embodiments of the circuitry 32 or controller, etc. . . . , operatively connected to receive signals transmitted by the sensor 14 can optionally be programmable or otherwise compatible with a plurality of different electric devices 39, which can be connected to communicate with the circuitry 32 via a hardwired communication channel 34 or a wireless communication channel (e.g., infrared, RF, short-range wireless communication protocol such as that referred to by the trade name Bluetooth™, 802.1x standards maintained by IEEE, etc. . . . ). According to such embodiments, the circuitry 32 can be operable to transmit a signal that can change a television channel, adjust the volume of a television, etc. . . . If the television is ever replaced, the circuitry can be synced with, or otherwise rendered compatible with the new television in a manner analogous to a so-called universal remote control.

According to alternate embodiments, the electric device 39 can be an adapter that cooperates with an existing electric device 39, thereby allowing the circuitry 32 to be retrofit (e.g., used with existing electric devices 39 such as lamps, for example) that may not be otherwise adapted to communicate with the circuitry 32. For example, the electric device 39 in the form of an adaptor can be plugged into a conventional AC electric wall outlet commonly found in residential dwellings. A lamp with a dimmable bulb can be plugged into the adaptor. The circuitry 32 can communicate with the adaptor to control operation of the lamp (e.g., on/off, intensity settings, etc. . . . ) via a wireless communication channel, or via the wired communication channel 34. For wireless embodiments, a battery or other stored energy device can optionally be embedded out of view in the cabinet 10 or furniture to supply electric energy to the circuitry 32 to facilitate operation of the sensor 14 and the circuitry 32, including any optional wireless transmitter or other transmission circuit for transmitting signals over the hardwired communication channel 34. According to alternate embodiments, the hardwired communication channel 34 can include a power cable plugged into the conventional AC electric wall outlet. The circuitry 32 of such embodiments can optionally be adapted to transmit control signals to the adaptor through the wiring in the residential dwelling that conducts electric power to the AC electric wall outlets.

The location and/or patterns 24, 26, 28 (FIG. 2) of the operable surface of the sensor 14 can optionally be denoted and made visible when the outwardly-exposed surface of the veneer 16 or existing surface of the wall 10 is viewed. For example, a plurality of different, contrasting veneers 16 can be adhered to the flush surface collectively formed by the wall 10 and the sensor 14. According to alternate embodiments, inlays, decorative overlays, carvings in the veneer 16 or existing wood surface of the wall 10 concealing the sensor 14, any other suitable method of identifying the location of the concealed sensor 14, or any combination thereof, can be utilized to indicate the presence of a touch-sensitive region. For example, the location and/or pattern of the sensor(s) 14 may be denoted based on the geometry and/or physical configuration of the collective furniture object including the embedded sensor 14. As an alternative to having markings visible when the surface of the wood veneer 16 or existing wood surface of the wall 10 concealing the sensor 14, a proximity sensor 50 (FIG. 5) can optionally be arranged to detect the presence of the user's hand when placed adjacent to the sensor 14 to input an adjustment of the electric device being controlled.

Unlike conventional touch-sensitive lamps, for example, which allow users to input commands to turn the lamp on/off by touching any location on the exposed metal surface of the lamp's base, the present technology limits the region that is touch sensitive to the regions adjacent to the sensor 14. This touch sensitive region has a perimeter in a major plane that is at least partially, and optionally substantially or entirely surrounded by a non-touch-sensitive region of the cabinet or furniture, formed from a non-electrically-conductive material.

Figure 5:
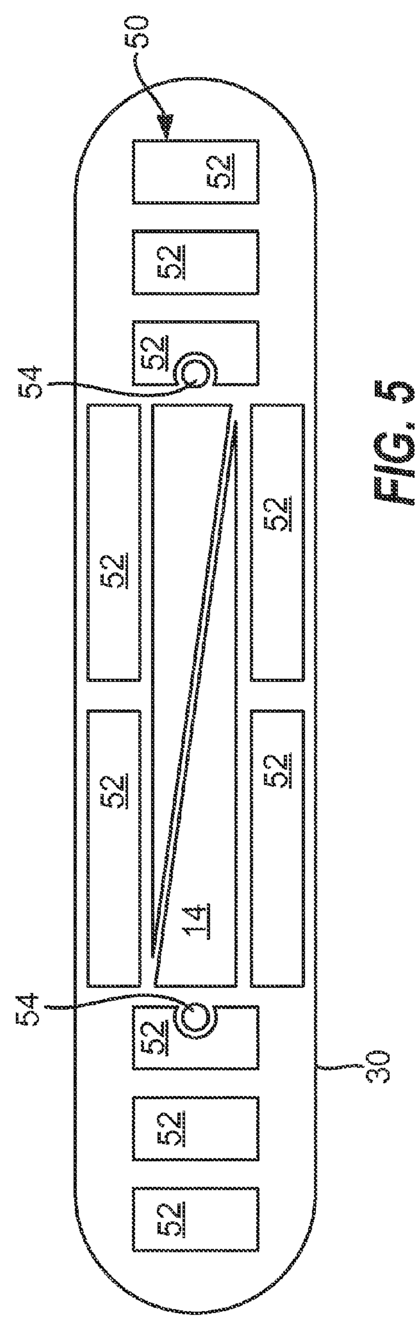
FIG. 5 shows an illustrative embodiment of a printed circuit board including a sensor, a proximity sensor surrounding the sensor, and a plurality of light sources.

An illustrative embodiment of such a proximity sensor 50 is shown in FIG. 5. A high sensitivity, low accuracy, touch sensor includes a plurality of separate touch pads 52 arranged to at least partially, and optionally substantially surround the sensor 14, which is formed from a plurality of sensor segments in FIG. 5. Each of the touch pads 52 can be operatively connected to the printed circuit board 30 to transmit a signal to a controller in response to a user's hand being placed within a close proximity (e.g. within one (1") inch) thereof. Although shown as a plurality of touch pads 52, alternate embodiments of the proximity sensor 50 can include a single touch pad with a void in which the sensor 14 can be arranged. However, for the sake of brevity, the proximity sensor in FIG. 5 is shown and described as being formed from a plurality of separate touch pads 52 that are collectively operable to detect the presence of the user's hand adjacent to the sensor 14, even if the user's hand is not centered above the sensor 14. And regardless of the configuration of the proximity sensor 50, the proximity sensor 50 provides operable coverage over a greater area than the sensor 14 to detect the user's hand even when not centered directly over the sensor 14.

In response to detecting the user's hand in close proximity to the sensor 14, a microprocessor executing computer-executable instructions stored by a non-transitory computer memory, an application-specific integrated circuit, etc. . . . provided to the circuitry 32 or controller that received the signal(s) from the proximity sensor 50 can transmit a signal that illuminates the surface by activating buried LEDs 54, lamps or other indicators located adjacent to the sensor 14, optionally connected to the printed circuit board 30, to frame or otherwise indicate the location and/or pattern of the sensor 14. For the illustrative embodiment shown in FIG. 5, a LED 54 is arranged on the printed circuit board 30 adjacent to each longitudinal end of the sensor 14, thereby denoting the ends of the sensor 14 when the externally-exposed surface of the veneer 16, existing wood of the wall 10 or other overlay concealing the sensor 14 is viewed from a vantage point external of the veneer of the cabinet or furniture.

Figure 6:
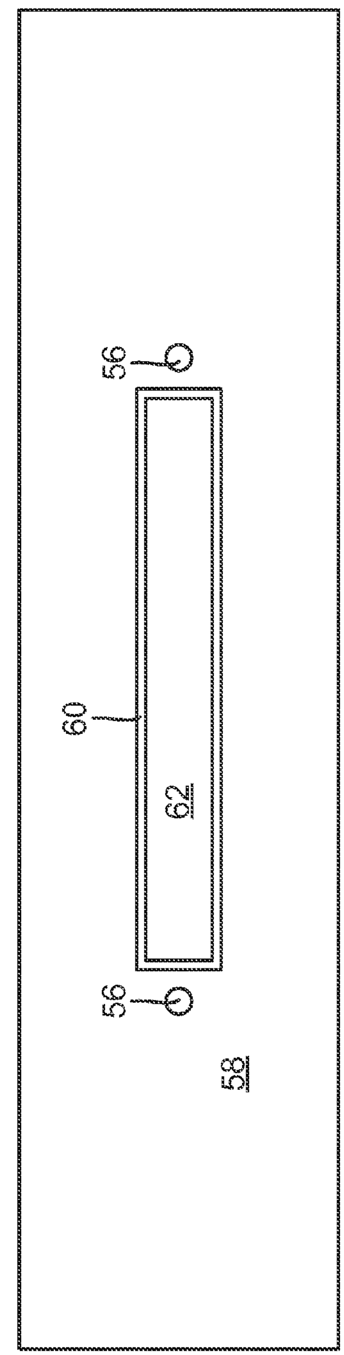
FIG. 6 shows an illustrative embodiment of an overlay that is to cover the printed circuit board shown in FIG. 5.

FIG. 6 is a view of an underside of an illustrative example of a veneer 16 that is to be applied over the surface of the wall 10 flush with the sensor 14 shown in FIG. 5, with window regions 56 described below arranged over the LEDs 54. The veneer 16 of FIG. 6 can selectively transmit light from the LED 54 or other light source provided to the printed circuit board 30 to denote the location, and optionally the pattern, of the sensor 14. Although described as a veneer 16, the overlay concealing the sensor 14 from view when installed can be the existing wood of the wall 10 remaining following routing from beneath described above, a plastic or other non-metal substance, or any other object that is to conceal the sensor 14. As shown, the veneer 16 includes windows 56 as regions of reduced thickness (i.e., the dimension perpendicular to—or extending into and out of—the major plane of the drawing sheet) relative to the thickness of surrounding portions of the veneer 16. For example, a window region 56 that is to be arranged over the LED 54 in FIG. 5 when the veneer 16 is installed can have a material thickness that is less than the material thickness of a surrounding, light-impeding region 58 that is to be offset relative to the LED 54. Light emitted by the LED 54 (FIG. 5) in response to the detection, by the proximity sensor 50 (FIG. 5), of the user's hand in close proximity to the sensor 14 is observable through the window region 56, but substantially blocked by the light-impeding region 58.

In addition to, or in lieu of the window region 56, the veneer 16 in FIG. 6 can include a frame region 60 that at least partially, and optionally fully surrounds a light-impeding region 62 that is shaped and sized to be arranged over the sensor 14 shown in FIG. 5. The frame region 60 includes a channel of reduced material thickness relative to the material thickness of the light-impeding regions 58 and 62. Thus, in response to detection of the user's hand in close proximity to the sensor 14, light from the LEDs 54 in FIG. 5, and/or additional LEDs (not shown) or other illumination devices, is transmitted more readily through the frame region 60 than through the light-impeding regions 58 and 62. The result is the temporary illumination of a frame surrounding the sensor 14 (FIG. 5) concealed by the veneer 16 (FIG. 6). The extent to which the material thickness of the window and/or frame regions 56, 60 must be reduced relative to the light-impeding regions 58, 62 can be dependent on the species of wood used for the veneer 16.

Although the window and frame regions 56, 60 are described in detail, it is understood that any desired pattern, shapes, etc. . . . can be created in this manner to provide an externally-visible display helpful to the user input a command via the sensor 14 or convey other information to the user. For example, rather than utilizing different material thicknesses to create the externally-visible display, other embodiments can include a mask layer and/or ink that create a stencil through which light from the LED 54 or other light source can shine. Other embodiments can include, an arrangement including a pattern of separate LEDs, or one or more LEDs molded or otherwise formed in a specific shape corresponding to the desired pattern to be illuminated in response to transmission of the signal from the proximity sensor 50. Yet other embodiments can include a fiber-optic light conductor arranged in the form of the desired pattern to conduct and emit light from a LED or other light source.

Figure 7:
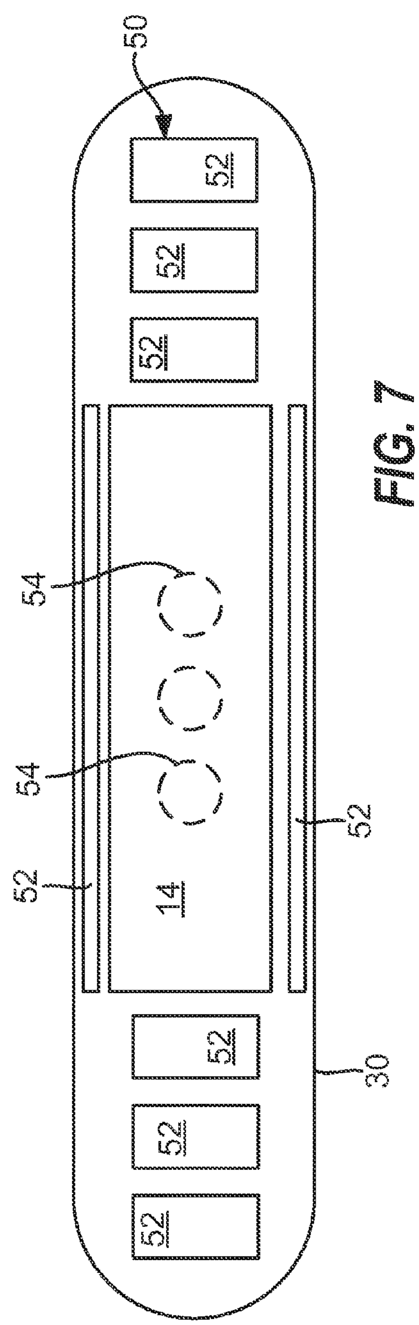
FIG. 7 shows an illustrative embodiment of a substantially-transparent printed circuit board with underlying LED illumination sources.

FIG. 7 shows an alternate embodiment of a sensor 14 that can be manipulated by the user to input a numerical selection, for example. Again, the sensor 14 can be substantially surrounded by the proximity sensor 50 to detect the presence of the user's hand adjacent to the sensor 14. One, or a plurality of LEDs 54 are bottom mounted beneath a portion of the printed circuit board 30, separated from the sensor 14 surface by the printed surface board 30. For such embodiments, at least a portion (optionally less than all), or optionally all of the printed circuit board 30 can be formed from an un-dyed material, that is substantially transparent (e.g., translucent). The transparency of the material forming the printed circuit board 30 allows light emitted by the underlying LEDs 54 to be transmitted through the printed circuit board 30, thereby illuminating the sensor 14 from below. According to alternate embodiments, the window regions 56 can optionally be formed in the shape of numbers, characters, symbols, etc. . . . , and the surrounding areas formed as the light-impeding materials.

Figure 8:
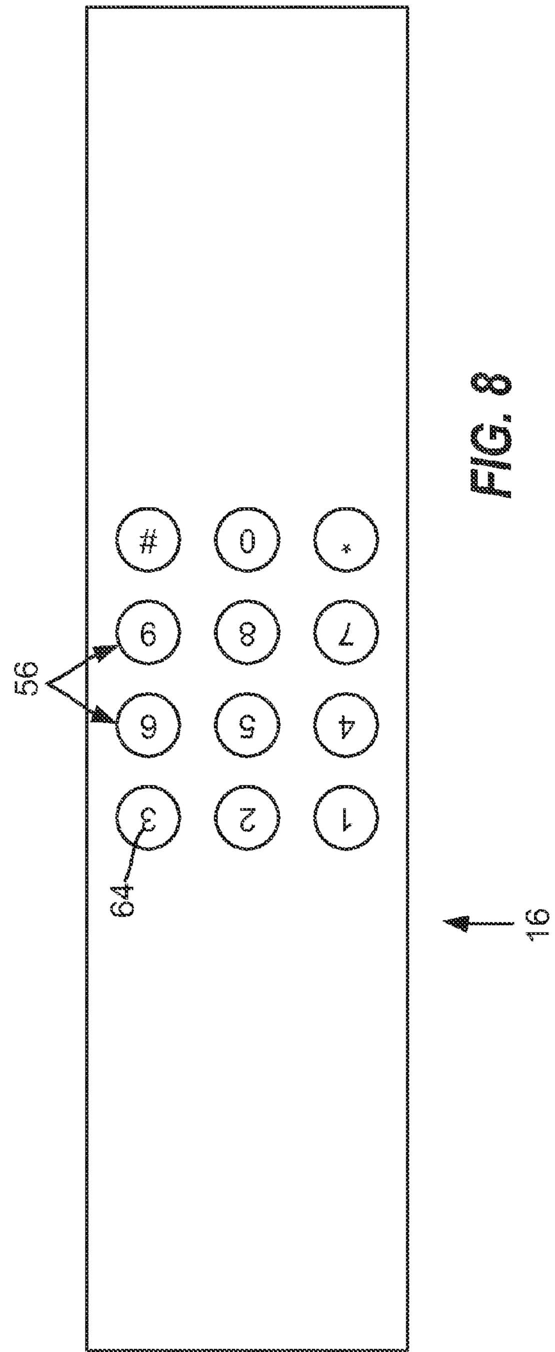
FIG. 8 shows an illustrative embodiment of an overlay that is to cover the printed circuit board shown in FIG. 7, the overlay comprising a plurality of window regions denoting locations of a sensor representing numerical input regions.

FIG. 8 shows a top view of a veneer 16 or other overlay according to such an embodiment, comprising a plurality of window regions 56, each arranged in an array resembling a number pad such as that provided on a computer keyboard, remote control, telephone, etc. . . . Similar to the previous embodiment, the window regions 56 can have a reduced material thickness, can be formed from a substantially-transparent material, or otherwise allow the transmission of light from the LEDs 54 such that the window regions 56 are visible to the user when the LEDs 54 are illuminated. Each window region 56 can optionally include a character 64 such as a letter, number, symbol, etc. . . . formed from a light-impeding material. Thus, when the window regions 56 are illuminated when the veneer is concealing the sensor 14, the character 56 represented by each portion of the sensor 14 corresponding to the respective character can be observed.

Regardless of the structure and configuration of the devices used to denote the location, and optionally the pattern of one, or a plurality of, sensors 14, the light source illuminated in response to the signal transmitted by the proximity sensor 50 can be turned off after having been activated for a predetermined period of time. For example, the circuitry 32 can optionally include a timer that causes the light source to be illuminated for 10 seconds after the user's hand is no longer in close proximity to the sensor(s) 14 before being automatically turned off. Thus, the system can illuminate the display when desired and conserve energy when not in use, regardless of whether electric energy is supplied by battery or from an electric outlet operatively connected to an electric utility.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

Illustrative embodiments have been described, hereinabove. It will be apparent to those skilled in the art that the above devices and methods may incorporate changes and modifications without departing from the general scope of this invention. It is intended to include all such modifications and alterations within the scope of the present invention. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An apparatus for controlling an electric device, the apparatus comprising:

a cabinet forming a portion of a piece of furniture and defining a recess;

a sensor disposed within said recess for sensing the presence of a foreign object in close proximity to the sensor;

a veneer concealing the sensor disposed within said recess from view during user interaction with said sensor and when observed from an ambient environment of the cabinet, said veneer comprising an externally-exposed surface with an appearance of a material from which the cabinet is made;

a controller that communicates with the electric device and is responsive to a signal transmitted by the sensor indicative of the presence of the foreign object adjacent to the sensor to transmit a control signal to be received by the electric device at a location located separate from the piece of furniture for controlling operation of the electric device operatively connected to at least receive a communication transmitted by the controller;

an illumination device concealed by the veneer, wherein the illumination device, when illuminated, backlights a portion of the veneer; and a proximity sensor guarding at least a portion of the sensor to sense the foreign object being positioned adjacent to the sensor and, in response to sensing the foreign object, transmit a signal that, when received by the controller, causes the controller to illuminate the illumination device.

2. The apparatus of claim 1, wherein the sensor is a capacitive sensor that senses a capacitance change resulting from placement of the foreign object in close proximity to the sensor.

3. The apparatus of claim 1, wherein the recess is formed in an arm rest portion of the piece of furniture on which a user is to sit.

4. The apparatus of claim 1, wherein the recess is formed in a base portion of a lamp.

5. The apparatus of claim 1, wherein the sensor comprises a plurality of isolated regions over which the foreign object travels in a continuous motion to establish a slider function that gradually adjusts a quality of the electronic device.

6. The apparatus of claim 1, wherein the controller is adapted to illuminate the illumination device for a predetermined length of time following separation of the foreign object from the sensor as sensed by the proximity sensor.

* * * * *